(12) United States Patent
Sutardja

(10) Patent No.: US 6,462,688 B1
(45) Date of Patent: Oct. 8, 2002

(54) DIRECT DRIVE PROGRAMMABLE HIGH SPEED POWER DIGITAL-TO-ANALOG CONVERTER

(75) Inventor: Sehat Sutardja, Cupertino, CA (US)

(73) Assignee: Marvell International, Ltd., Hamilton (BM)

( * ) Notice: Subject to any disclaimer, the term of this patent is extended or adjusted under 35 U.S.C. 154(b) by 0 days.

(21) Appl. No.: 09/737,474

(22) Filed: Dec. 18, 2000

(51) Int. Cl.$^7$ ............................................... H03M 1/66
(52) U.S. Cl. ....................................... 341/144; 341/143
(58) Field of Search ................................ 341/143, 144, 341/153, 154

(56) References Cited

U.S. PATENT DOCUMENTS

| | | | | |
|---|---|---|---|---|
| 3,543,009 A | * | 11/1970 | Voelcker, Jr. ................ | 341/143 |
| 4,947,171 A | * | 8/1990 | Pfiefer et al. ................ | 341/143 |
| 5,625,357 A | * | 4/1997 | Cabler ......................... | 341/143 |
| 5,663,728 A | | 9/1997 | Essenwanger .............. | 341/153 |
| 5,936,450 A | | 8/1999 | Unger .......................... | 327/237 |
| 6,172,634 B1 | * | 1/2001 | Leonowich et al. ......... | 341/153 |
| RE37,619 E | | 4/2002 | Mercer et al. | |
| 2001/0050585 A1 | * | 12/2001 | Carr ............................. | 327/277 |

OTHER PUBLICATIONS

"Gigabit Ethernet 1000BASE-T", Gigabit Ethernet Alliance, copyright 1997.

* cited by examiner

Primary Examiner—Howard L. Williams
(74) Attorney, Agent, or Firm—Eric B. Janofsky; Katten Muchin Zavis Rosenman

(57) ABSTRACT

A current source is provided according to the present invention. The current source includes N current sources configured in a parallel arrangement, wherein N is at least two. Each of the N current sources includes a respective control input. The current source also includes M delay elements. An mth one of the M delay elements includes an input in communication with an m−1th one of the M delay elements. M is equal to N−1, and an output of the mth one of the M delay elements is arranged in communication with the control input of an m+1th one of the N current sources.

73 Claims, 9 Drawing Sheets

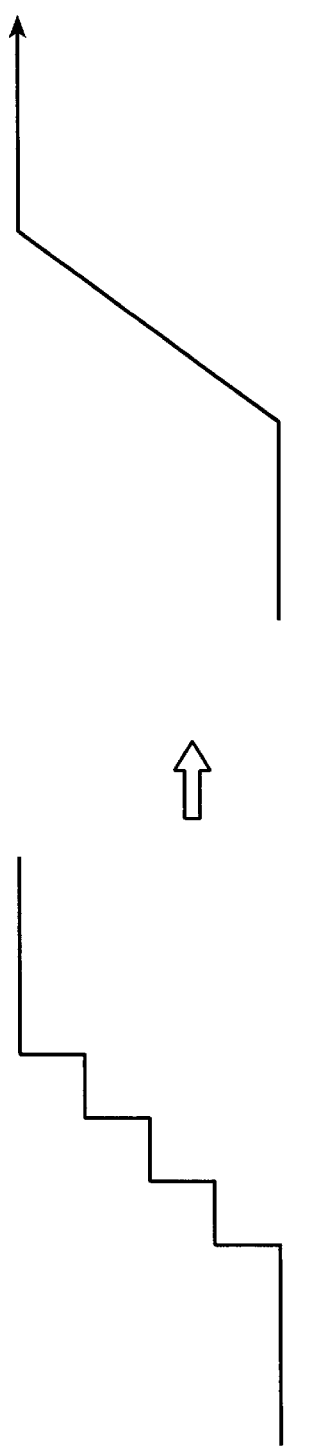
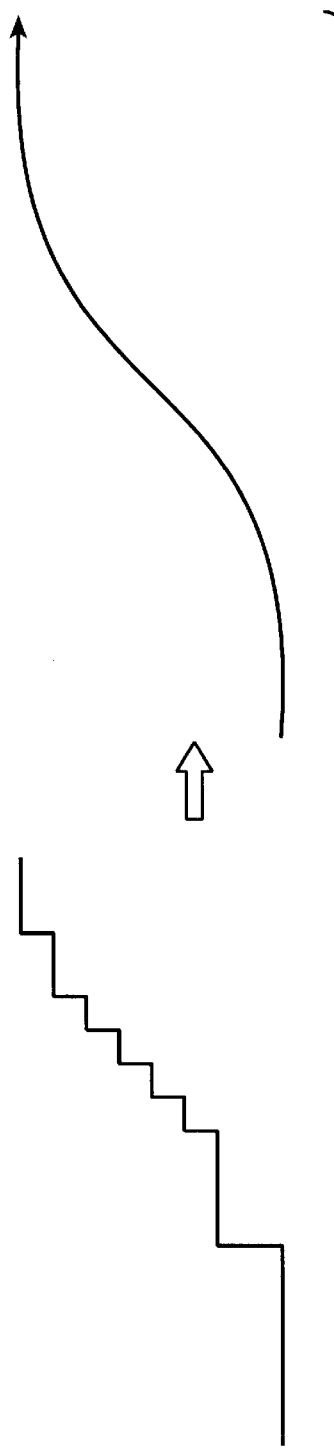
FIG. 15a
FIG. 15b

DIRECT DRIVE PROGRAMMABLE HIGH SPEED POWER DIGITAL-TO-ANALOG CONVERTER

BACKGROUND OF THE INVENTION

Field of the Invention

The present invention relates generally to signal processing and signal waveshaping. More particularly, the present invention relates to signal processing and signal waveshaping of digital-to-analog converters.

BACKGROUND AND RELATED ART

Digital-to-analog conversion involves the process of converting digital codes into a continuous range of analog signal levels (voltage or current), for example, as discussed in Chapter 31, "D/A and A/D Converters" of The Electrical Engineering Handbook, ed. Richard C. Dorf, CRC Press 1993, the contents of which are hereby incorporated by reference. A digital-to-analog converter (hereinafter a DAC) is generally an electronic circuit that receives an n-bit codeword from an interface and generates an analog voltage or current that is proportional to the codeword.

One example of a DAC is discussed in U.S. Pat. No. 5,663,728, entitled A Digital-To-Analog Converter (DAC) and Method that set Waveform Rise and Fall Times to Produce an Analog Waveform that Approximates a Piecewise Linear Waveform to Reduce Spectral Distortion, issued on Sep. 2, 1997, the contents of which are hereby incorporated by reference. The DAC of the U.S. Pat. No. 5,663,728 patent employs a waveform shaping circuit to control the rise and fall times of each component waveform so that the analog waveform rising and falling edges settle to within a desired error bound of a linear output ramp.

U.S. Pat. No. 5,936,450, entitled A Waveshaping Circuit Using Digitally Controlled Weighted Current Summing, issued on Aug. 10, 1999, the contents of which are hereby incorporated by reference, discloses a waveshaping circuit. The waveshaping circuit of the U.S. Pat. No. 5,936,450 patent includes a controller and a current summing circuit controlled by the controller. The current summing circuitry selectively sinks combinations of component currents in response to a sequence of control signal sets to generate an output current signal having a desired waveform.

Many DACs attempt to generate desired signal waveform in response to a digital signal. For the purposes of this discussion, a signal output may include the output of a DAC and/or the output of one or more signal components within a DAC. For example, a signal component may correspond to an individual bit of a codeword. One conventional method generates a signal output with a slew rate controlled current source, as shown in FIG. 1. The voltage V measured across a resistor R is shown in FIG. 2. The waveform V includes sharp transition areas (e.g., corners) 1, 2 and 3, which may introduce electromagnetic interference. Such interference may inhibit accurate signal processing.

Another circuit which generates an output signal employs a current mirror 10 having an RC filter, as illustrated in FIG. 3. A current source I drives the current mirror 10. Current mirror 10 includes a first transistor 11 and a second transistor 12. Transistors 11 and 12 are preferably CMOS transistors. The first transistor 11 includes gate-to-drain feedback, and is coupled to transistors 12 through the RC filter. The RC filter limits rise and fall times of the input signal I. However, the R and C components are typically process and/or temperature dependent. Such dependence causes variation in the output waveform as shown in FIG. 4. The dashed lines in FIG. 4 represent arbitrary output responses due to temperature and/or process variation. A stable output signal is difficult to obtain with such a circuit.

FIG. 5 depicts a D/A circuit employing a DAC 32, a low pass filter 34, a voltage buffer 36, a transistor 38, and a resistor 39. Each level of a multilevel input signal is provided to DAC 32 for conversion to an analog signal. The LPF 34 then determines the rise time of the output of the DAC 32, and the output is passed to voltage buffer 36. This construction presents two problems. First, the R and C values of LPF 34 will vary with temperature and process variations, and the output signal will have a poor waveshape where the rise times are not constant. Second, since all input current is passed through the same DAC, and since bandwidth is a function of current level, each level of the multilevel signal will present a different rise time.

These signal processing problems are not adequately addressed in the art. Accordingly, there is a need for a current source to control an output signal which is independent of temperature and process considerations. There is also a need for a DAC to generate a signal having selectable transition areas (corners). There is a further need of a circuit to generate desirable waveshapes.

SUMMARY OF THE INVENTION

The present invention addresses these signal processing problems by providing a circuit to generate a desired output signal. The present invention also provides a DAC for converting a digital signal into an analog signal with a desirable waveshape.

According to a first aspect of the present invention, a current source includes N current sources configured in a parallel arrangement, wherein N is at least two. Each of the N current sources includes a respective control input. The current source includes M delay elements, with an mth one of the M delay elements including an input in communication with an m−1th one of the M delay elements. M is equal to N−1, and an output of the mth one of the M delay elements is arranged in communication with the control input of an m+1th one of the N current sources.

According to another aspect of the present invention, an apparatus includes N current sources configured in a parallel arrangement, wherein N is at least two. Each of the N current sources includes a respective control input and a respective biasing input. The apparatus also includes a biasing generator in communication with each of the biasing inputs of the N current sources, an apparatus input in communication with the control input of a first one of the N current sources, and M delay elements, with an mth one of the M delay elements including an input in communication with an m−1th one of the M delay elements. M is equal to N−1, and an output of the mth one of the M delay elements is arranged in communication with the control input of an m+1th one of the N current sources. The first one of the M delay elements is in communication with the apparatus input.

A method of supplying current is provided according to still another aspect of the present invention. The method includes the steps of: (i) arranging first through n current sources in a parallel arrangement, where n comprises the total number of current sources, and wherein the first current source supplies a first current and the second through n current source respectively supplies second through n currents; and (ii) delaying the second through n currents each with respect the first current.

These and other objects, features and advantages will be apparent from the following description of the preferred embodiments of the present invention.

BRIEF DESCRIPTION OF THE DRAWINGS

The present invention will be more readily understood from a detailed description of the preferred embodiments taken in conjunction with the following figures.

FIG. 15a is a graphical depiction of a waveform generated with uniform delay element.

FIG. 15b is a graphical depiction of a waveform generated with non-uniform delay element.

DETAILED DESCRIPTION OF THE PREFERRED EMBODIMENTS

The present invention will be described with respect to circuits and methods for shaping waveforms, and in particular, to a digital-to-analog converter (DAC) employing such a waveshaping circuit. However, as will be appreciated by those skilled in the art, the present invention is not limited to applications involving DACs, but also may be applied to other applications, such as signal processing, systems to control signal rise/fall time, signal storage, communications, etc. Moreover, while the present invention is particularly suited to applications in the read channel of a hard disk drive, many other applications will suggest themselves to persons of skill in the electrical engineering arts. Furthermore, the present invention is particularly suitable for use with the structure described in U.S. patent application Ser. No. 09/737743, entitled "Active Replica Transformer Hybrid", filed concurrently herewith, the contents of which are incorporated herein by reference.

Figure 6:
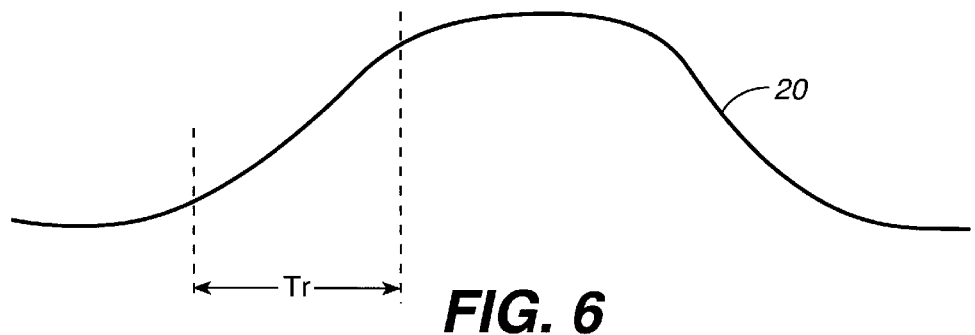
FIG. 6 is a graphical depiction of a waveshape having smooth transition areas.

FIG. 6 illustrates a desired signal output 20. The output waveform 20 includes smooth transition areas, which reduce noise such as electromagnetic interference. A preferred rise time ("$T_r$") for a DAC is 3–5 nanoseconds (ns).

Figure 7:
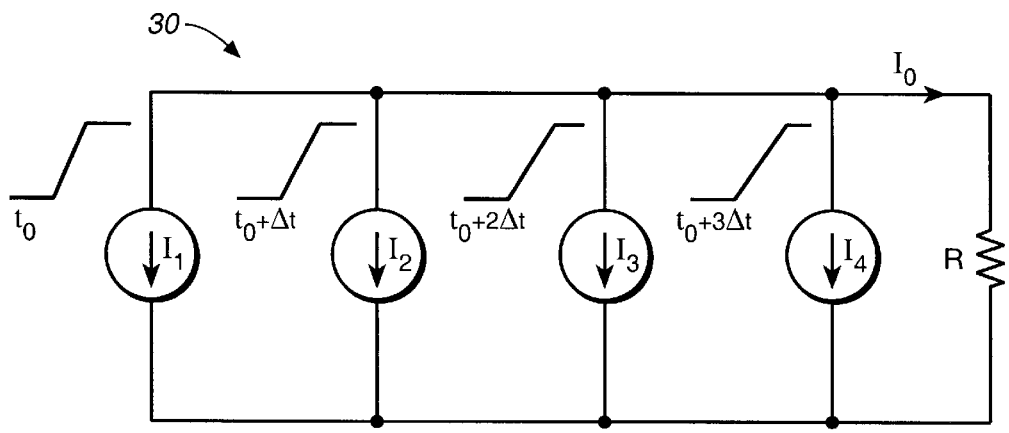
FIG. 7 is a circuit diagram of a current source according to the present invention.
Figure 8:
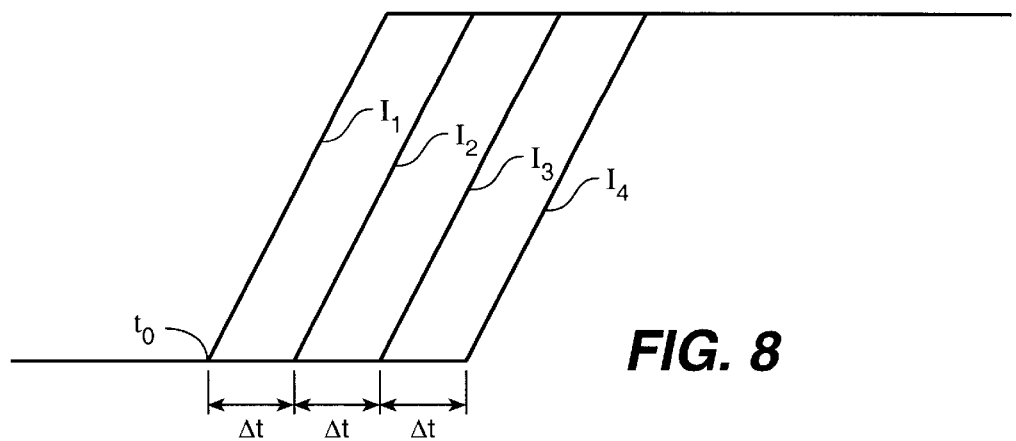
FIG. 8 is a graphical depiction of current components of the current source illustrated in FIG. 6.

The present invention generates a signal to approximate the desired signal output 20 with a current source 30. As shown in FIG. 7, current source 30 includes a plurality of current sources. For example, current source 30 may include current sources $I_i$, $I_2$, $I_3$ and $I_4$. Current sources $I_1$, $I_2$, $I_3$ and $I_4$ each preferably generate a respective current $I_n$, where n is 1, 2, 3 or so forth. The signals $I_n$ are preferably equal in magnitude and form, and may include a signal delay. In the FIG. 7 example, current sources $I_n$ each generate a linear ramp. For example, consider a signal I1, which includes a linearly rising edge starting at time t0. Current I2 mirrors current I1, except that I2 includes a linearly rising edge starting at time t0+Δt. The variable Δt represents an amount of delay time. Current I3 mirrors currents I1 and I2, except that current I3 includes a linearly rising edge starting at time t0+2Δt. Similarly, current I4 mirrors currents I1, I2, and I3, except that its linearly rising edge starts at time t0+3Δt. The relative waveform components for currents $I_1$, $I_2$, $I_3$ and $I_4$ are shown in FIG. 8.

Figure 9:
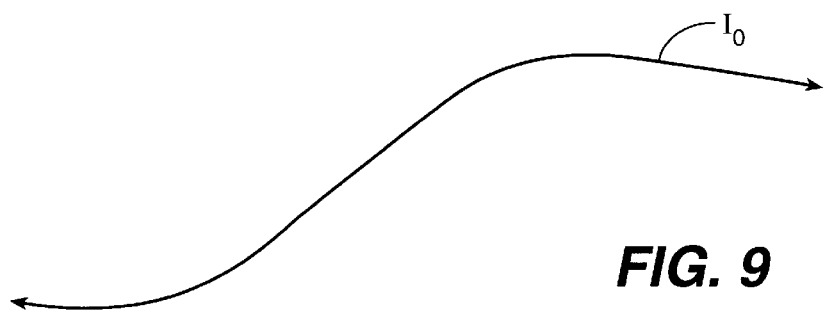
FIG. 9 is a graphical depiction of a resultant output waveshape from the current source illustrated in FIGS. 6 and 7.

Currents I1, I2, I3 and I4 are summed (or mixed) to produce a resultant waveform I0 as shown in FIG. 9. Waveform I0 approximates the desired output signal shown in FIG. 6. Like the desired output signal of FIG. 6, waveform I0 has many desirable properties. For example, I0 has selectable transition areas (corners). The transition areas can be smooth, or sharp, by selectively adjusting the length of Δt. Also, waveform I0 accommodates arbitrary rise/fall times.

Figure 10:
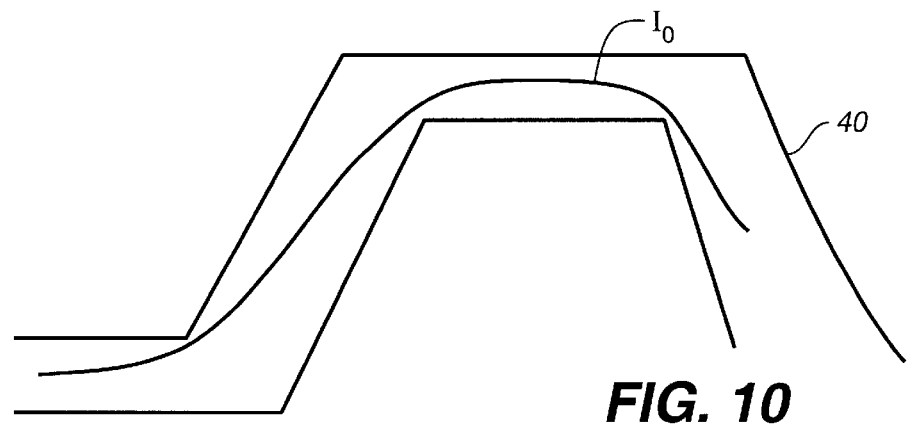
FIG. 10 is a graphical depiction of a waveform template, and a waveshape that fits within the template.

The waveform I0 can also be adjusted by varying Δt to fit within specified requirements. For example, with reference to FIG. 10, waveform I0 can be adjusted to fit within a template 40, for example, as provided by the IEEE standard waveform shape. In this example, I0 has been optimized to produce low electromagnetic interference and to fit within the IEEE template 40.

The delay variable Δt is preferably controlled using a delayed-locked loop or is controlled by reference to an external clock. As such, Δt can be precisely regulated. A waveform which is independent of temperature and/or process considerations can then be generated.

The generation of a linear ramp is explained with reference to FIGS. 11–13. A signal is produced from current source 50, which includes a plurality of current sources I1 through In. Each of the plurality of current sources generates a replica signal I. In this example, input signal I is preferably a square waveform. The signal I is delayed by Δt from each subsequent current source, after the initial current source I1. For example, I2 is delayed by Δt, and In is delayed by n–Δt. The currents are summed (or mixed) in a known manner to produce an output which approximates a linear ramp.

Figure 12A:
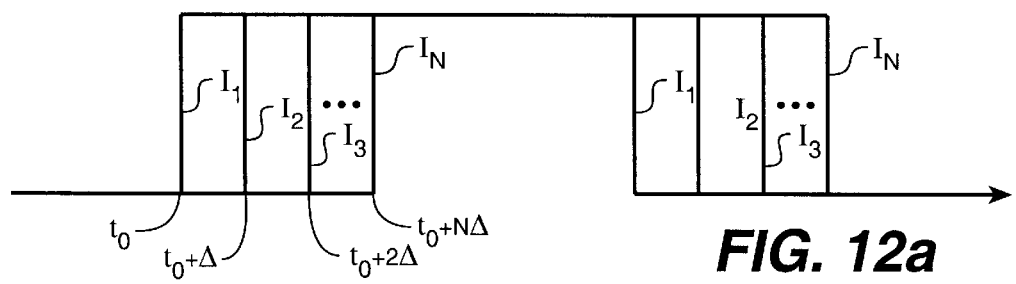
FIGS. 12a–12c are graphical depictions of waveshapes generated by the current source of FIG. 10.
Figure 12B:
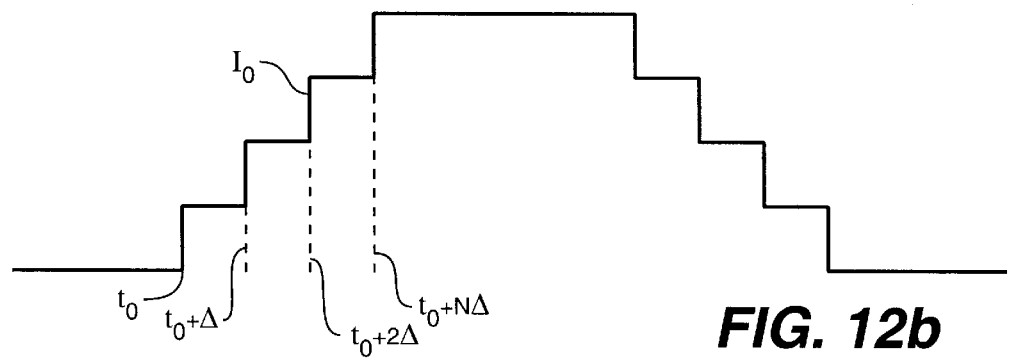
Figure 12C:
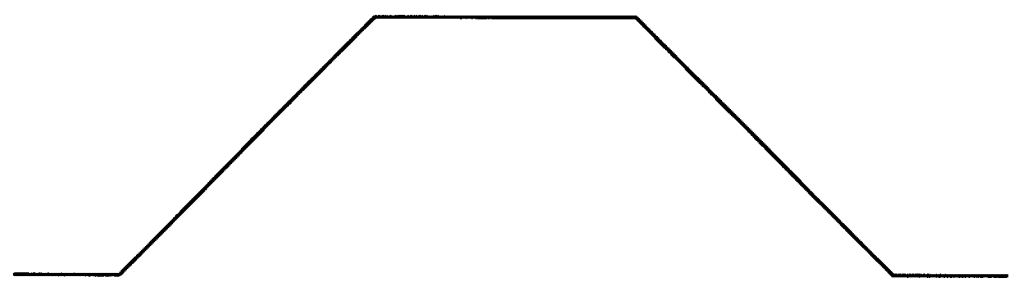

With reference to FIG. 12a, the signal components of the individual current sources are relatively illustrated. FIG. 12b illustrates the resultant waveshape I0, which includes a stair-step pattern. A linear ramp, as shown in FIG. 12c, is approximated as the length of the delay variable Δt is decreased.

Figure 13:
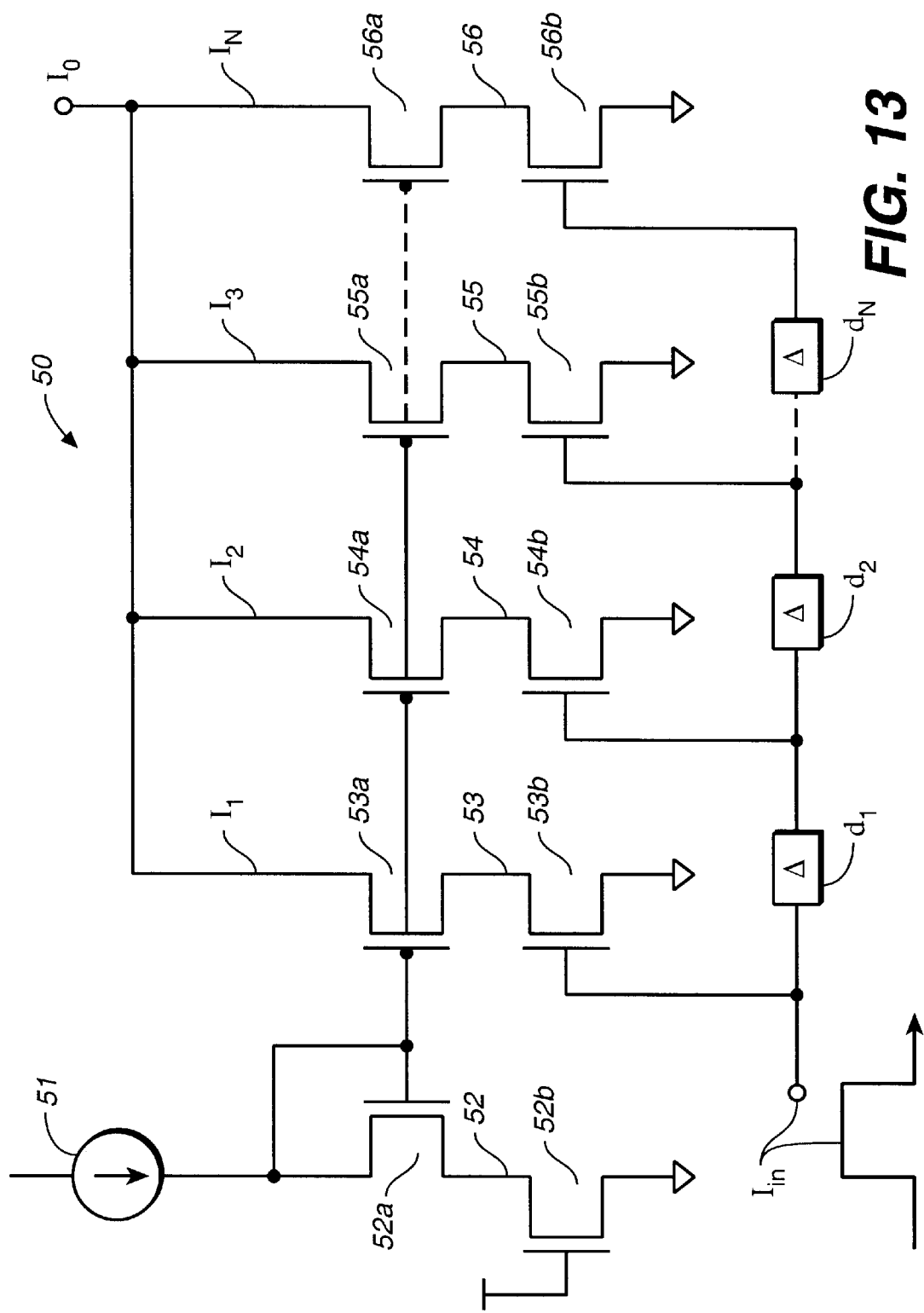
FIG. 13 is a circuit diagram of a current source according to the present invention.

A circuit diagram of the current source 50 is shown in FIG. 13. Current source 50 includes a plurality of transistor pairs 52–56, where pair 56 represents the nth transistor pair. With reference to FIG. 13, a current source 51 drives transistor pair 52. Transistor pair 52 includes a transistor 52a communicating with a transistor 52b. Transistor 52a is preferably configured with gate-to-drain feedback. The gate of transistor 52b is biased so as to operate in an "on" state.

The gate/drain of transistor 52a communicates with the gates of transistors 53a, 54a, 55a and 56a. The drains of transistors 53a–56a each communicates with an output Io. The gates of transistors 53b–56b each communicates with an input waveform Iin (e.g., a square signal), some through delay elements. For example, the gate of transistor 54b communicates with waveform Iin through delay element d1. The gate of transistor 55b communicates with waveform Iin through delay element d2 and delay element d1. Similarly, the gate of transistor 56b communicates with waveform Iin through each of the delay elements d1 through dn. In the preferred embodiment, each of delay elements d1–dn delays the signal by Δ. Delay elements can be realized via known delay locked loops.

The operational aspects of FIG. 13 are now even further explained. Initially, waveform Iin is communicated to the gate of transistor 53b, which turns on the transistor pair 53. A signal I1, which is proportional to the waveform Iin, is output at Io. Waveform Iin is also communicated to delay element d1, which delays the waveform by Δ seconds. After Δ seconds, delay element d1 communicates the delayed waveform to the gate of 54b, which turns on the transistor pair 54. A signal I2, which is proportional to Iin, is output at Io. The resultant waveform Io includes the sum (or mixture) of signals I1 and I2. The input waveform Iin is respectively delayed before communicating with the gates of transistors 55b and 56b. Transistor pairs 55 and 56 are activated (e.g., turned on) and respectively supply current I3 and In, which are added to the resultant waveform I. The current source 50, as shown in FIG. 11, is therefore realized.

Figure 1:
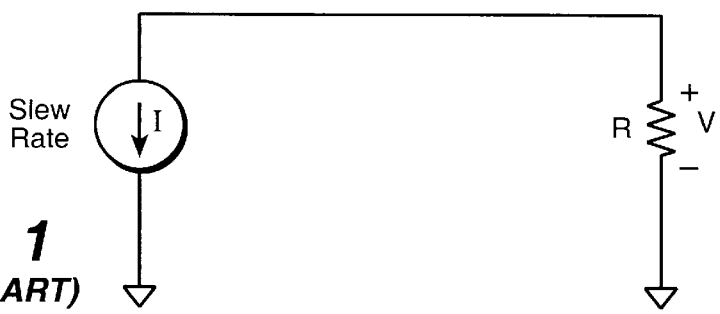
FIG. 1 is a diagram of a conventional circuit, which includes a slew rate controlled current source.
Figure 2:
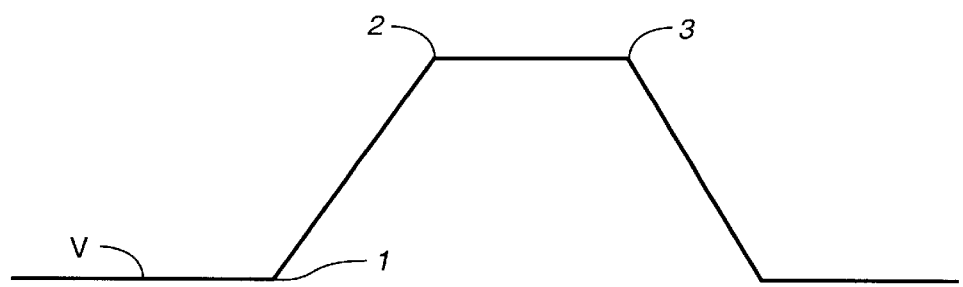
FIG. 2 is a graphical depiction of a waveshape corresponding to an output of the FIG. 1 circuit.
Figure 3:
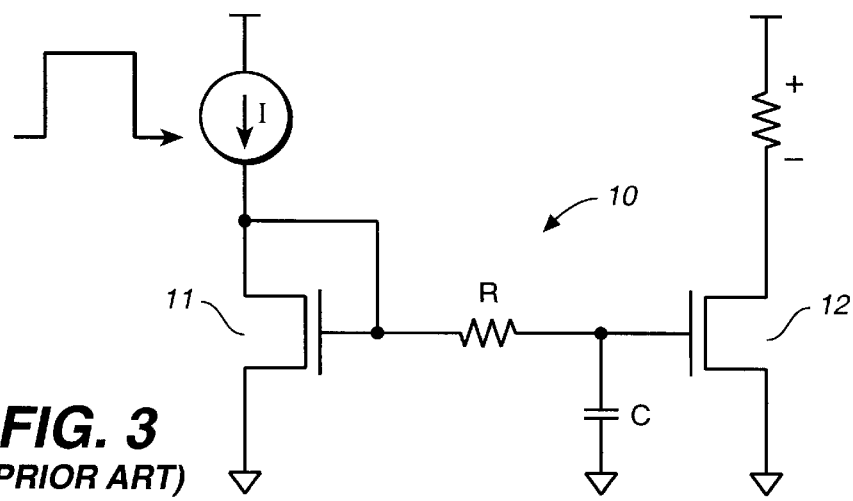
FIG. 3 is a view of a conventional circuit including a current mirror having an RC filter.
Figure 4:
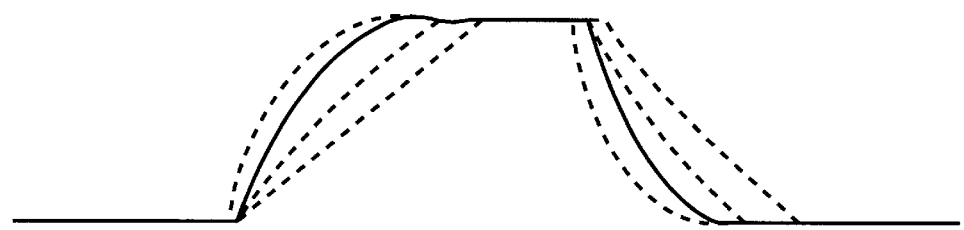
FIG. 4 is a graphical depiction of a waveshape corresponding to an output of the FIG. 3 circuit.
Figure 5:
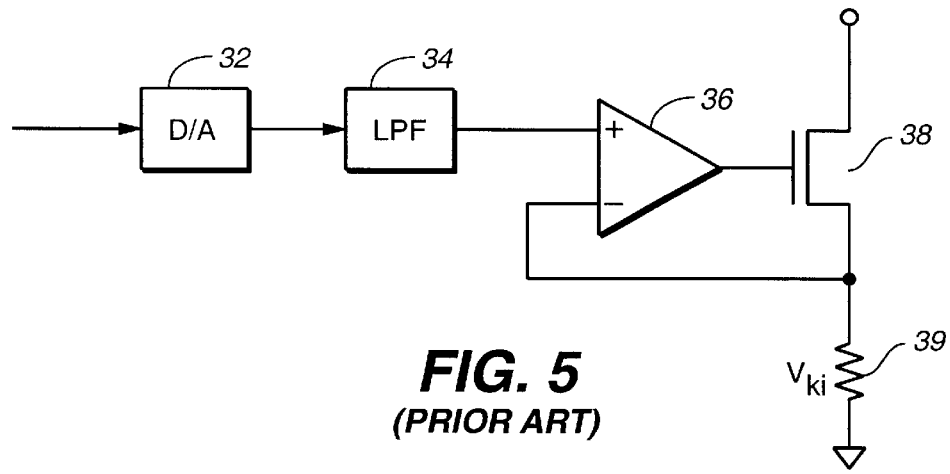
FIG. 5 is a schematic block diagram of a D/A circuit.
Figure 11:
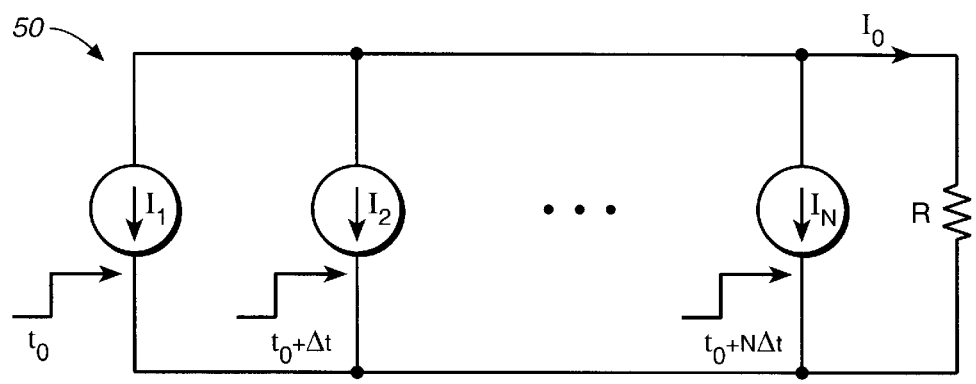
FIG. 11 is a circuit diagram of a current source according to the present invention.

There are many advantages of the configurations shown in FIGS. 11 and 13. For example, individual current sources (e.g., In) can be turned on/off on demand, particularly since Vgs is large and constant. Also, the current source 50 will generally consume less power than the current mirror shown in FIG. 3, particularly since a current mirror typically employs a DC bias. An additional advantage is that with a small Iin, the VGS voltage is also small (e.g., close to the threshold voltage VT). In such a case, VGS–VT–VDS equals a small number of current sources with negative VDS.

Figure 14:
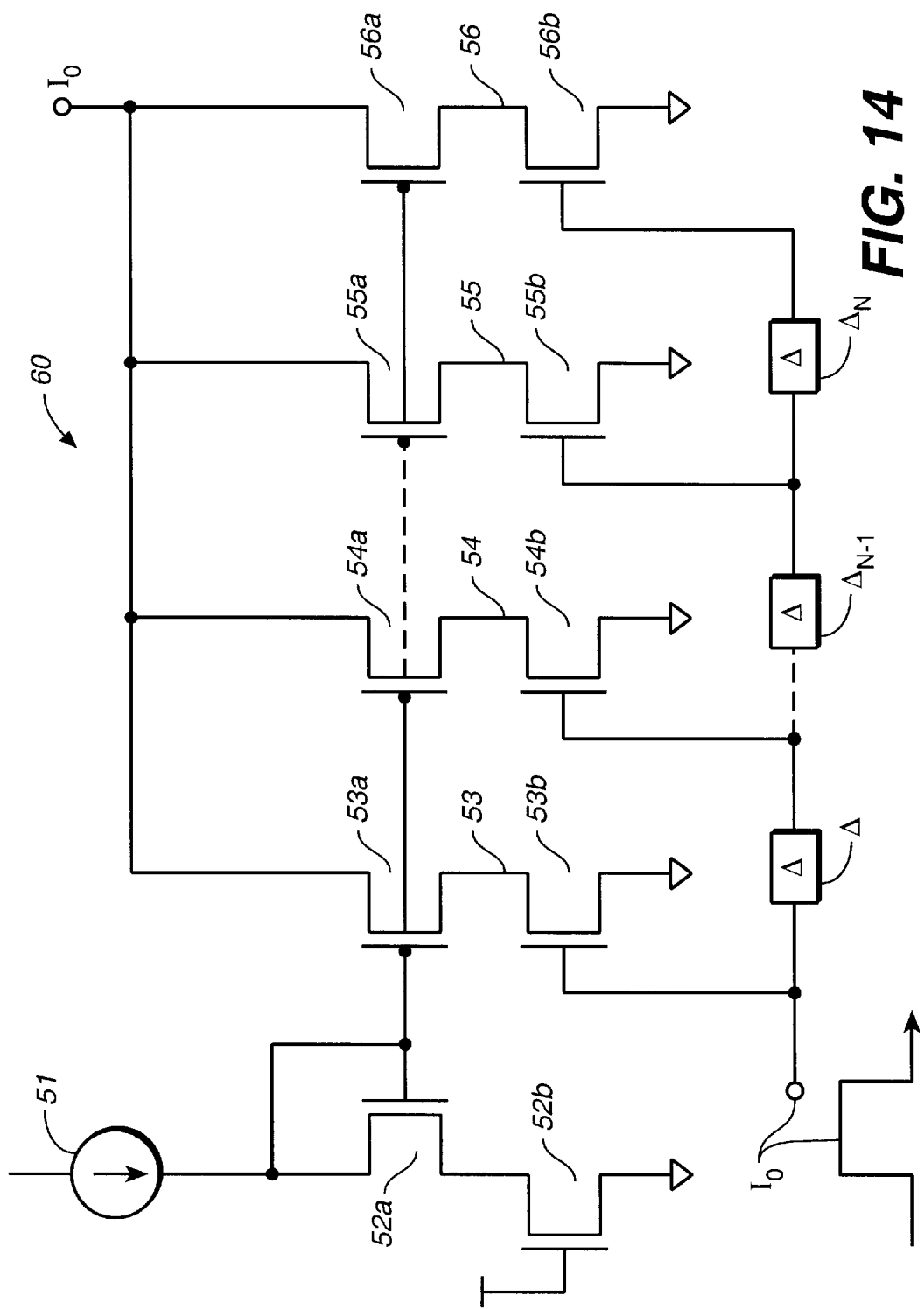
FIG. 14 is a circuit diagram of a current source having variable delay elements according to the present invention.

A further current source 60 is shown in FIG. 14. The current source 60 is configured in the same manner as the current source 50 shown in FIG. 13, except that the delay elements may include variable delays. The same components with respect to FIG. 13 are labeled with their same reference numerals in FIG. 13. In the FIG. 14 embodiment, delay elements Δ are non-uniform throughout the circuit. For example, Δ may involve a longer delay than Δn-1, and so forth. Non-uniform delays may be employed to generate a smooth waveform. Multiple delay-locked-loops are preferably used to achieve different delay times.

To illustrate, an output waveform processed with uniform delay elements is shown in FIG. 15a. Here a stair step waveform is produced, which may approximate a linear ramp, particularly as the variable Δ is decreased in length (e.g., time). In contrast, the amount of delay is varied with respect to individual delay elements as shown in FIG. 15b. The approximated waveshape of FIG. 15b is smooth (e.g., includes smooth transition areas) in comparison to the approximated linear waveshape of FIG. 15b. Seven steps (or corresponding current sources) are employed in a preferred embodiment for a Gigabit channel. Of course, the number of levels may be varied according to need or design without deviating from the scope of the present invention.

Figure 16:
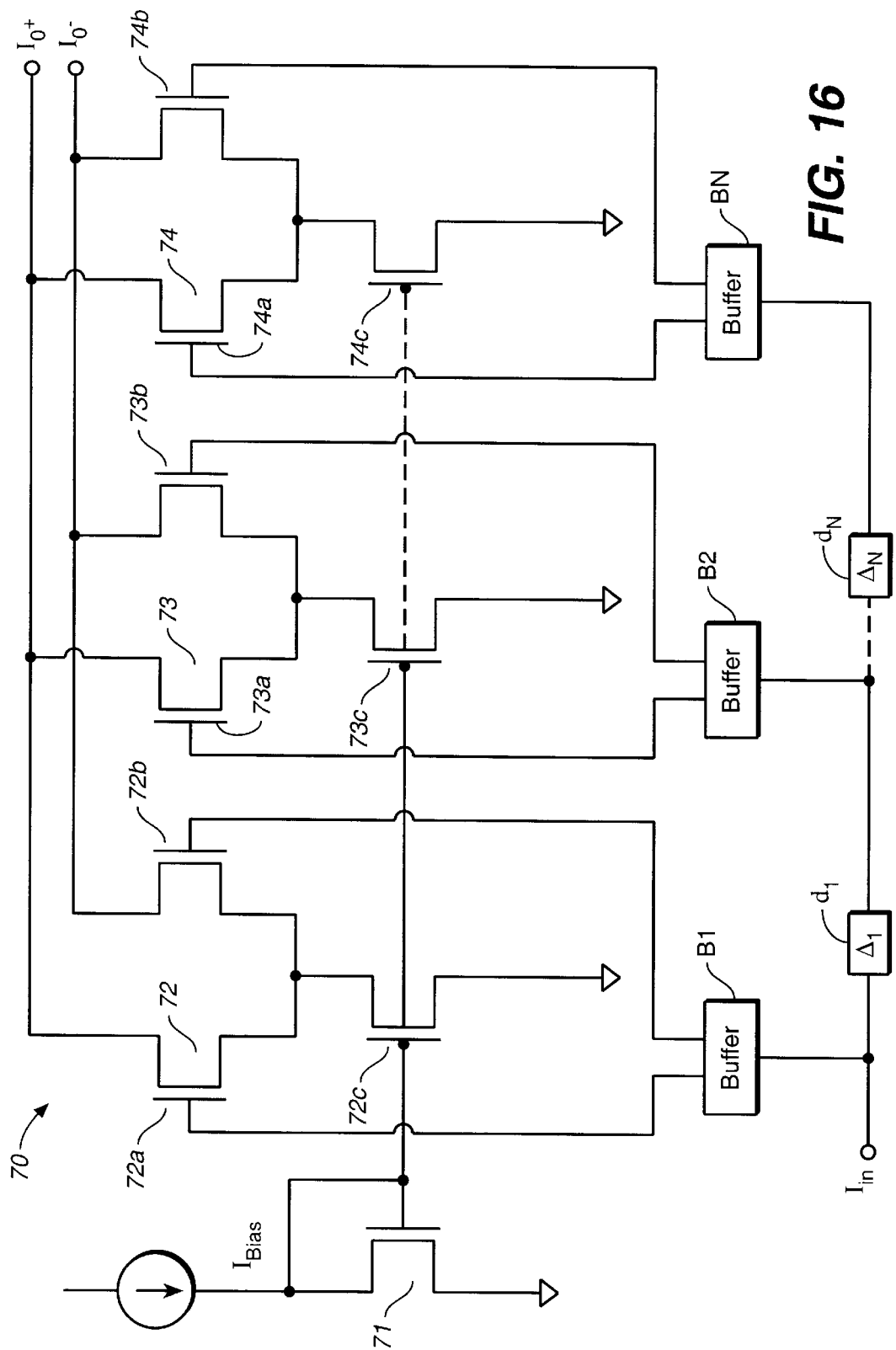
FIG. 16 is a circuit diagram of a current source including a plurality of differential transistor pairs according to the present invention.

A further embodiment of a current source is illustrated in FIG. 16. The illustrated current source 70 includes a plurality of differential transistor pairs 72–74, where 74 represents the nth differential transistor pair. A bias current $I_B$ is supplied to the gate of transistors 72c, 73c and 74c. An input waveform Iin is communicated to the gates of 72a, 72b, 73a, 73b, 74a and 74b. In the case of transistor pair 73 and 74, the input waveform Iin is delayed through delay elements d1 and d1+dn, respectively. Buffers B1–BN are optionally included in the circuit 70 to buffer the input signal Iin. A differential output (Io+, Io–) is accordingly produced.

The advantages of the FIG. 16 current source include constant power dissipation. Also, the circuit provides matching capabilities, for example, for use in an Ethernet channel.

Figure 17:
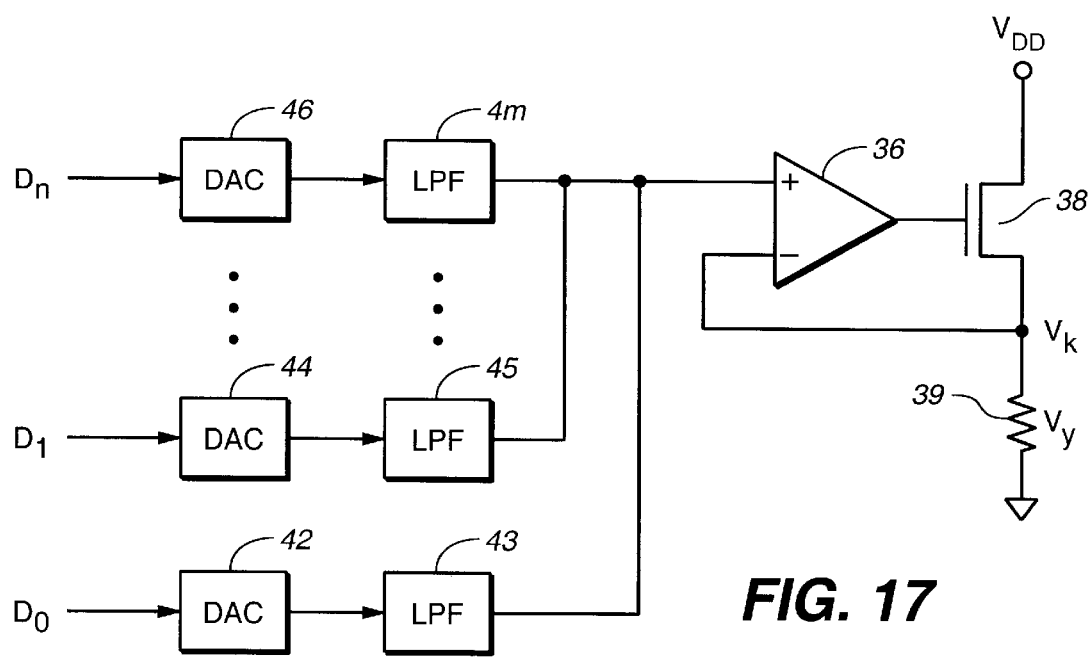
FIG. 17 is a circuit diagram of an alternative embodiment according to the present invention.

One drawback of the differential amplifier in FIG. 16 is that the differential amplifier is a Class A circuit which consumes unnecessary power even when no output is being transmitted. Moreover, a significant number of transistors is required to provide an adequately smoothed output current, thus requiring a large chip area. FIG. 17 depicts a schematic diagram of another embodiment according to the present invention which operates in Class B wherein one DAC is provided for each level of the multilevel input signal. DACs 42, 44, . . . 46 may be provided with corresponding LPFs 43, 45, 4m. Preferably, a circuit according to FIG. 13 supplies each DAC with a control current to provide a stair step output which defines the rise time. In such an embodiment, since each DAC receives control current, and not input current, the transistors which supply each DAC may be smaller than those used in the FIG. 13 embodiment. Additionally, since the control signal determines the rise time of the output of each DAC, the LPFs merely produce a smoother output.

In FIG. 17, multilevel input signal D0, D1, . . . Dn is provided to the parallel DACs 42, 44, . . . 46. The number of DACs may be varied depending on the application. This embodiment solves two problems. First, by providing the FIG. 17 circuit with a staircase waveform, for example, from FIG. 14, an LPF34 merely smoothes the staircase waveform rather than define rise time. Second, since the DACs are disposed in parallel, there will be no variations in rise time because each DAC has substantially the same current passing therethrough; that is there will be no bandwidth variation with resultant differences in rise time. The DACs may also be controlled by any appropriate circuitry, such as a decoder disposed prior to the DACs which would, in effect, select which DACs are activated by proper application of the input signals.

Thus, what has been described are circuits and methods to effectively shape a waveform. Furthermore, digital-to-analog conversion circuits employing such waveshaping circuits, which enhance signal conversion, have been described.

The individual components shown in outline or designated by blocks in the attached drawings are all well-known in the arts, and their specific construction and operation are not critical to the operation or best mode for carrying out the invention.

While the present invention has been described with respect to what is presently considered to be the preferred embodiments, it will be understood that the invention is not limited to the disclosed embodiments. To the contrary, the invention covers various modifications and equivalent arrangements included within the spirit and scope of the appended claims. The scope of the following claims is to be accorded the broadest interpretation so as to encompass all such modifications and equivalent structures and functions. For example, the input signals for FIGS. 7, 11, , 13, 14 and 16 may be varied to produce different output waveforms. Also, the linear ramp produced by the current source of FIGS. 11 and 13, may be even further processed by the current source of FIG. 7, to produce smooth transition areas. Such modifications are within the scope of the present invention. Also, whereas the illustrated transistors are preferably CMOS transistor, n-type or p-type transistors may also be employed with the present invention.

What is claimed is:

1. A current source comprising:

N current sources configured in a parallel arrangement, wherein N is at least two, and wherein each of the N current sources includes a respective control input; and M delay elements, an mth one of the M delay elements including an input in communication with an m−1th one of the M delay elements, wherein M is equal to N−1, and wherein an output of the mth one of the M delay elements is arranged in communication with the control input of an m+1th one of the N current sources, wherein the M delay elements comprise at least one delay lock loop.

2. A current source according to claim 1, wherein the mth one of the M delay elements comprises a proportional delay with respect to the m−1th one of the M delay elements.

3. A current source according to claim 1, wherein the M delay elements are controlled with reference to at least one external signal.

4. A current source according to claim 1, wherein a sum of the N current sources provides a linear ramp waveform.

5. A current source according to claim 1, wherein the N current sources each provide a square waveform.

6. A current source according to claim 1, wherein current provided by said current source comprises smooth transition areas.

7. A current source according to claim 1, wherein the mth one of the M delaying means comprises a proportional delay with respect to the m−1th one of the M delaying means.

8. A current source comprising:

N means for providing current configured in a parallel arrangement, wherein N is at least two, and wherein each of the N current providing means includes a respective means for inputting; and M means for delaying, an mth one of the M delaying means including means for inputting in communication with an m−1th one of the M delaying means, wherein M is equal to N−1, and wherein means for outputting of the mth one of the M delaying means is arranged in communication with the inputting means of an m+1th one of the N current providing means, wherein the M delaying means comprise at least one delay lock loop.

9. A current source according to claim 8, wherein the M delaying means are controlled with reference to at least one external signal.

10. A current source according to claim 8, wherein a sum of the N current providing means provides a linear ramp waveform.

11. A current source according to claim 8, wherein the N current providing means each provide a square waveform.

12. A current source according to claim 8, wherein current provided by said current source comprises smooth transition areas.

13. An apparatus comprising:

N current sources configured in a parallel arrangement, wherein N is at least two, and wherein each of the N current sources includes a respective control input and a respective biasing input; and a biasing generator in communication with each of said biasing inputs of the N current sources;

an apparatus input in communication with the control input of a first one of the N current sources; and M delay elements, an mth one of the M delay elements including an input in communication with an m−1th one of the M delay elements, wherein M is equal to N−1, and wherein an output of the mth one of the M delay elements is arranged in communication with the control input of an m+1th one of the N current sources, and wherein the first one of the M delay elements is in communication with the apparatus input, wherein the M delay elements comprise at least one delay lock loop.

14. An apparatus according to claim 13, wherein the mth one of the M delay elements comprises a proportional delay with respect to the m−1th one of the M delay elements.

15. An apparatus according to claim 13, wherein the apparatus input is in delayed communication, with respect to a first one of the N current sources, with a second one through the m+1 one of the N current sources.

16. An apparatus according to claim 13, wherein the M delay elements are controlled with at least one external signal.

17. An apparatus according to claim 13, wherein the M delay elements comprise a uniform delay with respect to one another.

18. An apparatus according to claim 13, wherein the M delay elements comprise at least one delay element comprising a non-uniform delay.

19. An apparatus according to claim 13, wherein the N current sources each comprises a transistor pair including at least a first transistor in communication with a second transistor.

20. An apparatus according to claim 13, wherein the N current sources each comprises a differential transistor pair including at least a first transistor in communication with a second transistor, and wherein said apparatus further comprises an output to provide a differential current.

21. An apparatus according to claim 13, wherein the apparatus input communicates with a square waveform.

22. An apparatus comprising:

N means for providing current configured in a parallel arrangement, wherein N is at least two, and wherein each of the N current providing means includes respective means for inputting control signals and respective means for inputting biasing signals;

means for biasing in communication with each of said biasing inputting means of the N current providing means;

apparatus means for inputting signals in communication with the means for inputting control signals of a first one of the N current providing means; and M means for delaying, an mth one of the M delaying means including an input in communication with an m−1th one of the M delaying means, wherein M is equal to N−1, and wherein an output of the mth one of the M delaying means is arranged in communication with the control input of an m+1th one of the N current providing means, and wherein a first one of the M delaying means is in communication with the apparatus means for inputting signals, wherein the M delaying means comprises at least one delay lock loop.

23. An apparatus according to claim 22, wherein the mth one of the M delaying means comprises a proportional delay with respect to the m−1th one of the M delaying means.

24. An apparatus according to claim 22, wherein the apparatus means for inputting signals is in delayed communication, with respect to the first one of the N current providing means, with a second one through the m+1 one of the N current providing means.

25. An apparatus according to claim 22, wherein the M delaying means are controlled with at least one external signal.

26. An apparatus according to claim 22, wherein the M delaying means comprise a uniform delay with respect to one another.

27. An apparatus according to claim 22, wherein the M delaying means comprise at least one delay means comprising a non-uniform delay.

28. An apparatus according to claim 22, wherein the N current providing means each comprises a transistor pair including at least a first transistor in communication with a second transistor.

29. An apparatus according to claim 22, wherein the N current providing means each comprises a differential transistor pair including at least a first transistor in communication with a second transistor, and wherein said apparatus further comprises an output to provide a differential current.

30. An apparatus according to claim 22, wherein the apparatus means for inputting signals communicates with a square waveform.

31. An electrical circuit comprising:

N transistor pairs configured in a parallel arrangement, where N comprises the total number of transistor pairs, wherein each of the transistor pairs comprises a first transistor in communication with a second transistor;

a biasing transistor in communication with each of the first transistors of the N transistor pairs;

a circuit input in communication with the second transistor of a first one of the N transistor pairs;

an output in communication with each of the first transistors of the N transistor pairs; and M delay elements, an mth one of the M delay elements including an input in communication with an m−1th one of the M delay elements, wherein M is equal to N−1, and wherein an output of the mth one of the M delay elements is arranged in communication with an m+1th one of the N transistor pairs, and wherein a first one of the M delay elements is in communication with the circuit input, wherein the M delay elements comprise at least one delay lock loop.

32. An electrical circuit according to claim 31, wherein each of the M delay elements provides a uniform delay.

33. An electrical circuit according to claim 31, wherein at least one of the M delay elements comprises a non-uniform delay with respect to the first one of the M delay elements.

34. An electrical circuit according to claim 31, wherein the M delay elements are controlled with at least one external signal.

35. An electrical circuit according to claim 31, wherein the circuit input communicates with a square waveform.

36. An electrical circuit according to claim 31, wherein the electrical circuit provides a current comprising smooth transition areas.

37. An electrical circuit comprising:

N means for providing current configured in a parallel arrangement, where N comprises the total number of current providing means, wherein each of the current providing means comprises first means for supplying current in communication with second means for supplying current;

means for biasing in communication with each of the first means for supplying current of the N current providing means;

circuit means for inputting signals in communication with the second means for supplying current of a first one of the N current providing means;

means for outputting signals in communication with each of the first means for supplying current of the N current providing means; and M means for delaying, an mth one of the M delaying means including means for inputting in communication with an m−1th one of the M delaying means, wherein M is equal to N−1, and wherein outputting means of the mth one of the M delaying means is arranged in communication with an m+1th one of the N current providing means, and wherein a first one of the M delaying means is in communication with the circuit inputting means, wherein the M delaying means comprise at least one delay lock loop.

38. An electrical circuit according to claim 37, wherein each of the M delaying means provides a uniform delay.

39. An electrical circuit according to claim 37, wherein at least one of the M delaying means comprises a non-uniform delay with respect to the first one of the M delaying means.

40. An electrical circuit according to claim 37, wherein the M delaying means are controlled with at least one external signal.

41. An electrical circuit according to claim 37, wherein the circuit inputting means communicates with a square waveform.

42. An electrical circuit according to claim 37, wherein the electrical circuit provides a current comprising smooth transition areas.

43. A method comprising the steps of:

providing N transistor pairs configured in a parallel arrangement, where N comprises the total number of transistor pairs, wherein each of the transistor pairs comprises a first transistor in communication with a second transistor;

biasing each of the first transistors of the N transistor pairs;

inputting a signal to the second transistor of a first one of the N transistor pairs;

outputting signals from each of the first transistors of the N transistor pairs; and providing M delay elements, an mth one of the M delay elements including an input in communication with an m−1th one of the M delay elements, wherein M is equal to N−1, and arranging an output of the mth one of the M delay elements in communication with an m+1th one of the N transistor pairs, and wherein a first one of the M delay elements is in communication with the input signal, wherein the M delay elements comprise at least one delay lock loop.

44. A method according to claim 43, wherein each of the M delay elements provides a uniform delay.

45. A method according to claim 43, wherein at least one of the M delay elements comprises a non-uniform delay with respect to the first one of the M delay elements.

46. A method according to claim 43, further comprising the step of controlling the M delay elements with at least one external signal.

47. A method according to claim 43, wherein the input signal comprises a square waveform.

48. A method according to claim 43, wherein the electrical circuit provides a current comprising smooth transition areas.

49. Digital-to-analog conversion apparatus, comprising:
   structure providing a multilevel digital control signal so that each level has a substantially similar bandwidth;
   a plurality of parallel digital-to-analog converters, each receiving a level of the provided multilevel digital control signal, each digital-to-analog converter converting the received level of the digital control signal into an analog signal; and
   structure combining outputs of said plurality of parallel digital-to-analog converters,
   further comprising a plurality of low pass filter respectively coupled to outputs of said plurality of parallel digital-to-analog converters.

50. Apparatus according to claim 49, further comprising a plurality of transistors supplying the multilevel digital control signal to said structure providing.

51. Apparatus according to claim 49, further comprising a resistor ladder supplying the multilevel control signal to said structure providing.

52. Apparatus according to claim 49, further comprising a voltage buffer connected to said structure combining.

53. Apparatus for converting a multilevel digital control signal into an analog signal, comprising:
   means for providing the multilevel digital control signal where each level has a substantially similar bandwidth;
   a plurality of digital-to-analog conversion means, coupled to said means for providing such that each digital-to-analog conversion means receives a different level of the multilevel digital control signal, each of said plurality of digital-to-analog conversion means converting the received level into an analog signal;
   means for combining the converted analog signals from said plurality of digital-to-analog conversion means, to form an analog output signal; and
   a plurality of low pass filter means respectively coupled to outputs of said plurality of digital-to-analog conversion means.

54. Apparatus according to claim 53, wherein said means for providing comprises a transistor array.

55. Apparatus according to claim 53, wherein said means for providing comprises a resistor ladder.

56. A direct drive programmable high speed power digital-to-analog converter comprising:
   a first digital to analog converter responsive to a first control signal;
   a second digital to analog converter responsive to a second control signal;
   a voltage buffer responsive to said first and second digital to analog converters to provide an analog output;
   a decoder to provide the first control signal to said first digital to analog converter and the second control signal to the second analog to digital converter,
   wherein the first digital to analog converter is activated in response to the first control signal,
   wherein the second digital to analog converter is activated in response to the second control signal,
   wherein said first and second control signals determine a slew rate of the analog output.

57. A converter of claim 56, wherein to said first and second digital to analog converters provide substantially the same output level.

58. A converter of claim 56, further comprising first and second control signal generators to generate the first and second control signals, respectively.

59. A converter of claim 58, wherein the first and second control signals have a stair step shape.

60. A converter of claim 58, wherein said first and second control signal generators each comprise:
   N current sources configured in a parallel arrangement, wherein N is at least two, and wherein each of the N current sources includes a respective control input; and
   M delay elements, an mth one of the M delay elements including an input in communication with an m−1th one of the M delay elements, wherein M is equal to N−1, and wherein an output of the mth one of the M delay elements is arranged in communication with the control input of an m+1th one of the N current sources.

61. A direct drive programmable high speed power digital-to-analog converter comprising:
   a first digital to analog converter responsive to a first control signal;
   a second digital to analog converter responsive to a second control signal;
   a voltage buffer responsive to said first and second digital to analog converters to provide an analog output;
   a decoder to select any combination of said first and second digital to analog converters,
   wherein said first and second control signals determine a slew rate of the analog output,
   further comprising first and second low pass filters, wherein said first low pass filter is responsive to said first digital to analog converter and said voltage buffer is responsive to said first low pass filter, and wherein said second low pass filter is responsive to said second digital to analog converter and said voltage buffer is responsive to said second low pass filter.

62. A direct drive programmable high speed power digital-to-analog converter comprising:
   first digital to analog converter means responsive to a first control signal for generating a first signal having a first output level;
   second digital to analog converter means responsive to a second control signal for generating a second signal having a second output level;
   a voltage buffer responsive to said first and second signals for providing an analog output;
   decoding means for providing the first control signal to said first digital to analog converter means and the second control signal to the second analog to digital converter means,
   wherein the first digital to analog converter means is activated in response to the first control signal,
   wherein the second digital to analog converter means is activated in response to the second control signal,
   wherein said first and second control signals determine a slew rate of the analog output.

63. A converter of claim 62, wherein the first and second output levels are substantially equal.

64. A converter of claim 62, further comprising first and second control signal generator means for generating the first and second control signals, respectively.

65. A converter of claim 64, wherein the first and second control signals have a stair step shape.

66. A converter of claim 64, wherein said first and second control signal generator means each comprise:
- N current sources means each for generating a current and configured in a parallel arrangement, wherein N is at least two, and wherein each of the N current sources includes a respective control input; and
- M delay means, an mth one of the M delay means including an input in communication with an m−1th one of the M delay means, wherein M is equal to N−1, and wherein an output of the mth one of the M delay means is arranged in communication with the control input of an m+1th one of the N current sources.

67. A direct drive programmable high speed power digital-to-analog converter comprising:
- first digital to analog converter means responsive to a first control signal for generating a first signal having a first output level;
- second digital to analog converter means responsive to a second control signal for generating a second signal having a second output level;
- a voltage buffer responsive to said first and second signals for providing an analog output;
- decoding means for selecting any combination of said first and second digital to analog converter means,
- wherein said first and second control signals determine a slew rate of the analog output,
- further comprising first and second low pass filter means for low pass filtering said first and second digital to analog converter means, and wherein said voltage buffer is responsive to said first and second low pass filter means.

68. A method for converting a digital signal to an analog signal comprising the steps of:
- (a) converting a digital signal to a first analog signal in response to a first control signal, the first analog signal having a first output level;
- (b) converting a digital signal to a second analog signal in response to a second control signal, the second analog signal having a second output level;
- (c) summing the first and second analog signals for providing an analog output;
- (e) decoding an input to generate the first and second control signals;
- (e) activating step (a) in response to the first control signal; and
- (f) activating step (b) in response to the second control signal;
- wherein said first and second control signals determine a slew rate of the analog output.

69. A method of claim 68, further comprising the step of
- (e) low pass filtering the first and second analog signals, wherein step (c) is responsive step (e).

70. The method of claim 68, wherein the first and second output levels are substantially equal.

71. A method of claim 68, further comprising the step of (f) generating the first and second control signals.

72. A method of claim 71, wherein the first and second control signals have a stair step shape.

73. A converter of claim 71, wherein step (f) comprises the steps of:
- supplying N sources of current, wherein N is at least two;
- controlling the supply of current frome ach of the N sources of current;
- delaying current from M of the N sources of current, where M is equal to N−1; and
- summing the current supplied from the N source of current.

* * * * *